(12) United States Patent
Koyama et al.

(10) Patent No.: US 6,759,600 B2
(45) Date of Patent: Jul. 6, 2004

(54) MULTILAYER WIRING BOARD AND METHOD OF FABRICATION THEREOF

(75) Inventors: Toshinori Koyama, Nagano (JP); Noritaka Katagiri, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 17 days.

(21) Appl. No.: 10/124,548

(22) Filed: Apr. 17, 2002

(65) Prior Publication Data

US 2002/0157864 A1 Oct. 31, 2002

(30) Foreign Application Priority Data

Apr. 27, 2001 (JP) ........................................ 2001-131287

(51) Int. Cl.[7] .......................... H05K 1/11; H01R 12/04
(52) U.S. Cl. ...................... 174/262; 174/255; 174/258; 174/261; 361/792; 361/795
(58) Field of Search ................................ 174/261, 260, 174/255, 256, 262, 264, 258; 361/792, 795, 760; 29/829, 830, 846

(56) References Cited

U.S. PATENT DOCUMENTS

| | | | | |
|---|---|---|---|---|
| 5,046,238 A | * | 9/1991 | Daigle et al. ................. 29/830 |
| 5,103,293 A | * | 4/1992 | Bonafino et al. ........... 257/702 |
| 5,451,721 A | * | 9/1995 | Tsukada et al. ............. 174/261 |
| 5,888,627 A | * | 3/1999 | Nakatani ..................... 428/209 |
| 6,565,954 B2 | * | 5/2003 | Andou et al. ............... 428/209 |
| 6,586,686 B1 | * | 7/2003 | Enomoto et al. ........... 174/262 |

FOREIGN PATENT DOCUMENTS

| | | |
|---|---|---|
| EP | 0851725 A1 | 7/1998 |
| JP | 9-199635 A | 7/1997 |
| JP | 2001-53198 A | 2/2001 |

* cited by examiner

*Primary Examiner*—Kamand Cuneo
*Assistant Examiner*—I. B. Patel
(74) *Attorney, Agent, or Firm*—Paul & Paul

(57) ABSTRACT

A multilayer wiring board comprising a plurality of conductor patterns stacked with an insulating layer composed of a thermosetting resin interposed between adjacent conductor patterns, wherein the insulating layers are each formed of a pair of film-like thermosetting resin layers and a resin film having a lower coefficient of linear expansion than, and sandwiched between, the thermosetting resin layers, and wherein the electrical connection between the stacked conductor patterns is established by vias formed through the insulating layers. A method of fabricating such a multilayer wiring board is also disclosed.

8 Claims, 6 Drawing Sheets

Fig.9
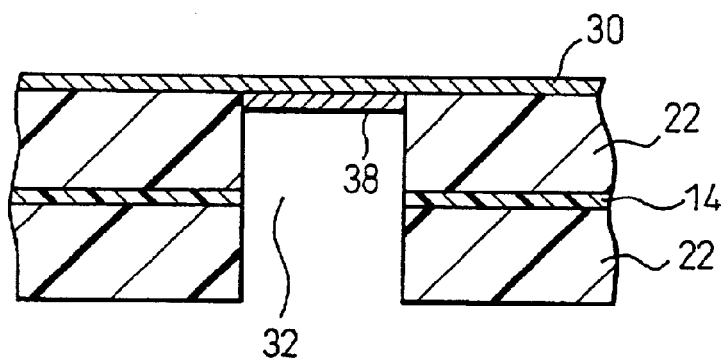
Fig.10A  Fig.10B
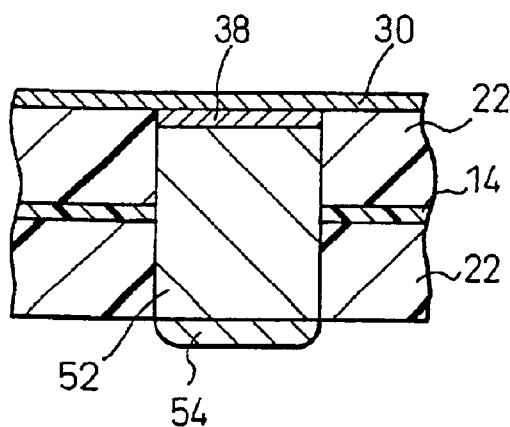 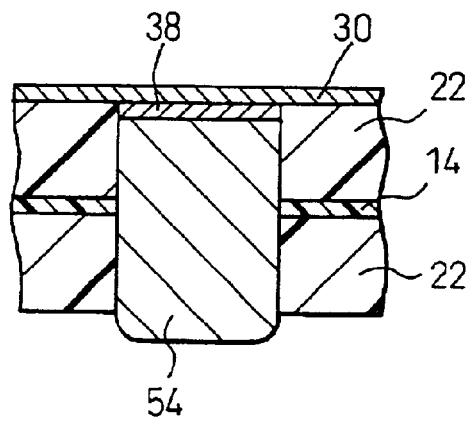

MULTILAYER WIRING BOARD AND METHOD OF FABRICATION THEREOF

BACKGROUND OF THE INVENTION

1. Field of the Invention

The present invention relates to a multilayer wiring board and a method of fabricating the same and, in particular, to a multilayer wiring board comprising a plurality of conductor patterns stacked with an insulating layer of a thermosetting resin interposed between adjacent conductor patterns, and a method of fabricating the multilayer wiring board.

2. Description of the Related Art

Various multilayer wiring boards each comprising a plurality of conductor patterns stacked with an insulating layer of a thermosetting resin interposed between adjacent conductor patterns are proposed in Japanese Unexamined Patent Publication No. 10-190232, etc.

These multilayer wiring boards, as shown in FIG. 7A, are each formed by integrally stacking a plurality of resin sheets 100 of a thermosetting resin which exhibits the bonding properties by heat treatment at a predetermined temperature.

Each resin sheet 100 includes a thermosetting resin layer 102 capable of exhibiting the bonding properties by heat treatment at a predetermined temperature, a conductor pattern 104 formed on one surface of the thermosetting resin layer 102, and at least a via 108 formed through the thermosetting resin layer 102. The via 108 has an end thereof connected to the conductor pattern 104 and the other end thereof exposed at a second surface of the thermosetting resin layer 102. The via 108 is formed of a recess 106 open to the second surface of the thermosetting resin layer 102 and having the bottom surface thereof exposed to the reverse surface of the conductor pattern 104, which recess 106 is filled, by electroplating, with a solder adapted to melt at a temperature lower than the temperature at which the thermosetting resin layer 102 exhibits the bonding properties.

A plurality of the resin sheets 100 shown in FIG. 7A are stacked and heat treated at a temperature enabling the thermosetting resin layers 102 to exhibit the bonding properties, whereby the multilayer wiring board shown in FIG. 7B can be produced. In the multilayer wiring board shown in FIG. 7A, the conductor patterns 104 stacked in multiple layers are electrically connected to each other by the vias 108.

The multilayer wiring board shown in FIG. 7B is configured to improve the dimensional and positional accuracy of the vias, etc. and can be easily reduced in thickness with the conductor patterns formed at a high density.

The resin sheets 100 constituting the multilayer wiring board shown in FIG. 7B, however, are each substantially formed of a thermosetting resin and therefore thermally expand/contract to a greater degree than package members mounted thereon such as a semiconductor element. It has been found, therefore, that the improvement in the reliability of connection between the multilayer wiring board and the package members such as a semiconductor element mounted thereon is limited.

In order to suppress the expansion/contraction of the multilayer wiring board, an attempt has been made to fabricate a multilayer wiring board using a resin sheet having arranged therein a reinforcing member composed of unwoven fabric such as glass cloth or organic fiber. Nevertheless, the multilayer wiring board finally produced by incorporating the reinforcing member of unwoven fabric such as glass cloth or organic fiber is found to increase in thickness undesirably, on the one hand, and cannot be easily formed with a fine via recess using a laser, on the other.

SUMMARY OF THE INVENTION

Accordingly, the object of the present invention is to provide a multilayer wiring board and a method of fabricating the same, which can improve the reliability of connection with the package members such as a semiconductor element mounted on the wiring board without using the reinforcing member composed of unwoven fabric such as glass cloth or organic fiber.

As the result of studying a solution to the aforementioned problem, the present inventor has developed this invention based on the discovery of the fact that a resin sheet, with a conductor pattern formed on one surface thereof, comprising a pair of film-like thermosetting resin layers and a resin film having a lower coefficient of linear expansion than, and sandwiched between, the film-like thermosetting resin layers is thermally expanded/contracted to a lesser degree during the process of fabricating a multilayer wiring board, thereby making it possible to improve the reliability of connection between the resulting multilayer wiring board and the package members such as a semiconductor element.

According to one aspect of the invention, there is provided a multilayer wiring board comprising a plurality of conductor patterns stacked with an insulating layer composed of a thermosetting resin interposed between adjacent conductor patterns, wherein the insulating layers each include a pair of film-like thermosetting resin layers and a resin film having a lower coefficient of linear expansion than, and sandwiched between, the thermosetting resin layers, and wherein the electrical connection between the stacked conductor patterns is established by vias formed through each insulating layer.

According to another aspect of the invention, there is provided a method of fabricating a multilayer wiring board comprising a plurality of integrally-stacked resin sheets each having one surface thereof formed with a conductor pattern;
 wherein each of the resin sheets includes a pair of film-like thermosetting resin layers adapted to exhibit the bonding properties when heat treated at a predetermined temperature, a resin film having a lower coefficient of linear expansion than and sandwiched between the thermosetting resin layers, a conductor pattern formed on one surface of the sandwich, and vias having an end thereof coupled to the reverse surface of the conductor pattern and the other end thereof exposed to a second surface of the sandwich,
 the method comprising the steps of:
  stacking a plurality of the resin sheets in such a manner that the exposed end of the via of each resin sheet is in contact with a predetermined portion of the conductor pattern of an adjacent resin sheet; and
  heat treating the resin sheets at a temperature enabling the thermosetting resin layers to exhibit the bonding properties thereby to integrate a plurality of the resin sheets.

According to this invention, a metal is filled by plating in each of the recesses, which are formed in the resin sheet and have the bottom thereof exposed to the reverse surface of the conductor pattern of the resin sheet, thereby forming vias with an end thereof coupled to the reverse surface of the conductor pattern and the other end thereof fixed at a predetermined portion of the conductor pattern of an adjacent resin sheet by a metal solder material or the like. In this way, the vias and the conductor patterns can be connected securely to each other.

The via and the conductor pattern can be fixed to each other easily by forming a metal solder layer at the end of the via.

The metal solder material desirably has a melting point higher than the thermosetting temperature of the thermosetting resin. The use of this metal solder material makes it possible to heat treat a plurality of resin sheets in stack in such a manner that the heat treatment temperature is increased to higher than the melting point of the metal solder material and then decreased to and held at the thermosetting temperature of the thermosetting resin for a predetermined length of time, or alternatively, the heat treatment temperature is increased to and held at the thermosetting temperature of the thermosetting resin for a predetermined length of time, and after the thermosetting resin layer is set, the temperature is increased to higher than the melting point of the metal solder material, followed by being decreased. In this way, the via and the conductor pattern can be connected positively to each other without causing any outflow of, or a void in, the metal solder material.

A resin film having a coefficient of linear expansion of not more than $20 \times 10^{-6}$/K at room temperature can be suitably used.

According to this invention, a multilayer wiring board comprising a plurality of resin sheets in a stack, each having a conductor pattern on one surface thereof, is fabricated. Each resin sheet includes a pair of film-like thermosetting resin layers adapted to exhibit the bonding properties when heat treated at a predetermined temperature, and a resin film having a lower coefficient of linear expansion than and sandwiched between the thermosetting resin layers. Even in the case where the resin sheets are heated during the fabrication process of the multilayer wiring board, therefore, the thermal expansion/contraction of the resin sheet can be reduced as compared with a resin sheet composed of a thermosetting resin layer alone.

With the multilayer wiring board according to the invention, therefore, the difference in thermal expansion/contraction between the wiring board and the package members such as the semiconductor elements can be reduced, thereby improving the reliability of connection between the semiconductor elements and the package members.

BRIEF DESCRIPTION OF THE DRAWINGS

FIG. 9 illustrates a barrier layer, which may be formed prior to the formation of vias.

FIG. 10A illustrates the formation of a via using plated copper and solder, and FIG. 10B illustrates the formation of a via using plated solder, on the barrier layer shown in FIG. 9.

DESCRIPTION OF THE PREFERRED EMBODIMENTS

Figure 1:
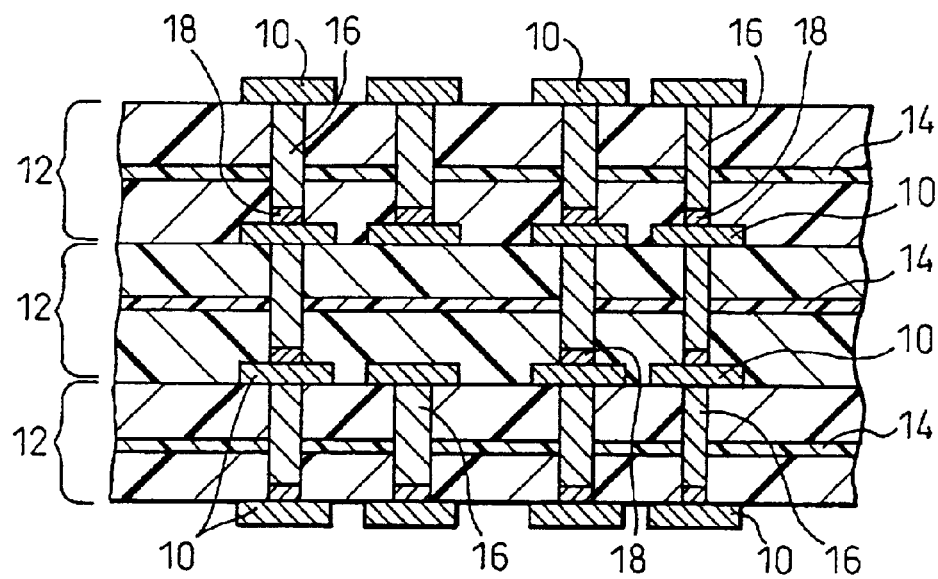
FIG. 1 is a partial sectional view showing an example of a multilayer wiring board according to the invention.

An example of a multilayer wiring board according to the invention is shown in a partial sectional view of FIG. 1. In the drawing, the multilayer wiring board includes insulating layers 12, each formed between adjacent layers of conductor patterns 10 stacked in multiple layers, and comprising a pair of film-like thermosetting resin layers composed of a thermosetting resin and a resin film 14 having a lower coefficient of linear expansion than and sandwiched between the thermosetting resin layers. The resin layer 12 is thus reinforced by the resin film 14 and is thermally expanded/contracted to a lesser degree, thereby making it possible to reduce the thermal expansion/contraction of the multilayer wiring board as a whole.

The conductor patterns 10 formed on the first surface of each insulating layer 12 are electrically connected, by vias 16 formed through the insulating layer 12, to the conductor patterns 10 of the upper and/or lower adjacent insulating layers 12.

A first end of each via 16 is connected to the reverse surface of a conductor pattern 10, and a second end thereof is fixed by a solder 18 constituting a metal solder material on the surface of the pad of another conductor pattern 10. By using the solder 18 making up a metal solder material this way, the second end of each via 16 and the pad surface can be connected securely to each other even in the presence of a gap between them.

The thermosetting resin used for the multilayer wiring board shown in FIG. 1 is, for example, epoxy resin or polyphenylene ether resin.

The coefficient of linear expansion of the resin film 14 is desirably not more than $20 \times 10^{-6}$/K at room temperature, or more desirably between $2 \times 10^{-6}$ and $4 \times 10^{-6}$/K. The material of the resin film 14 meeting this requirement is, for example, aramid, liquid crystal polymer or polyimide.

Figure 2:
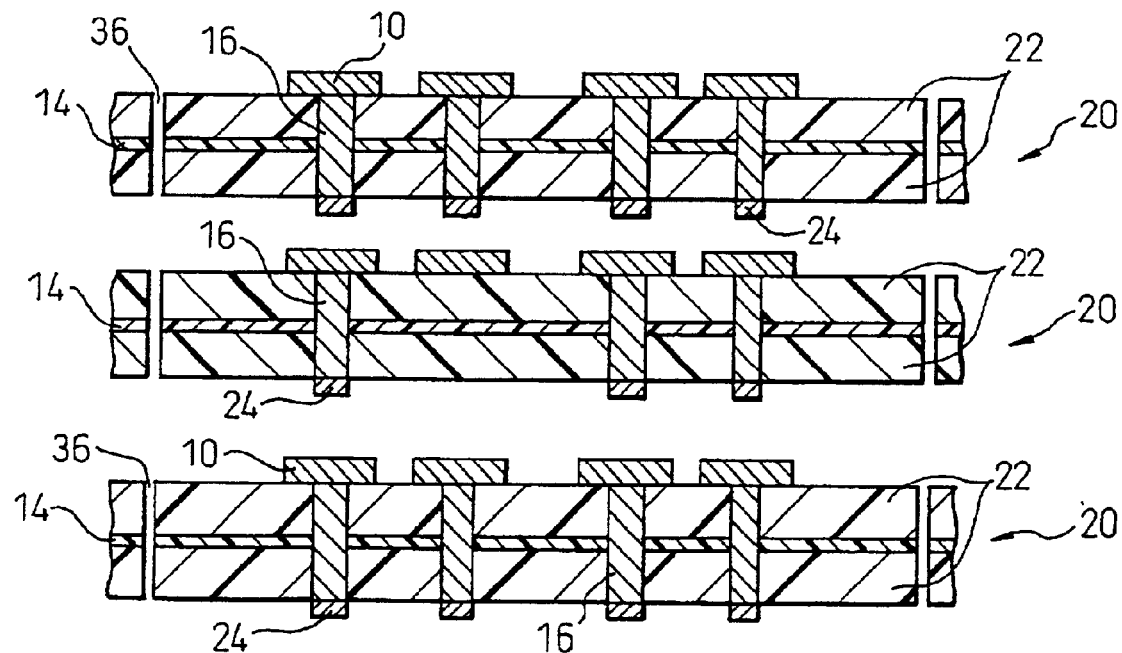
FIG. 2 illustrates a part of the process for fabricating the multilayer wiring board shown in FIG. 1.

The multilayer wiring board shown in FIG. 1 can be produced by integrally stacking a plurality of resin sheets 20 in the manner shown in FIG. 2. The resin sheets 20 each include a pair of film-like thermosetting resin layers 22 composed of a thermosetting resin capable of exhibiting the bonding properties when heat treated at a predetermined temperature (hereinafter sometimes referred to as the B-type thermosetting resin), a resin film 14 having a lower coefficient of linear expansion than and sandwiched between the thermosetting resin layers 22, and a conductor pattern 10 formed on the first surface of the sandwich.

The resin sheet 20 has vias 16 piercing through the thermosetting resin layers 22 and the resin film 14. The via 16 has a first end connected to the reverse surface of the conductor pattern 10 (the surface of the conductor pattern 10 in contact with a thermosetting resin layer 22), and a second end exposed to the surface of the resin sheet 20 lacking the conductor pattern 10. A solder layer 24 is formed on the exposed end of the via 16.

Each of the resin sheets 20 shown in FIG. 2 has through holes 36 for assuring alignment with another resin sheet.

This resin sheet 20 can be formed following the steps shown in FIG. 3. First, a laminate film 34 is prepared (FIG.

3A). This laminate film 34 includes a pair of thermosetting resin layers 22 about 50 μm thick composed of the B-type thermosetting resin, a resin film 14 about 4.5 to 9 μm thick having a lower coefficient of linear expansion than and sandwiched between the thermosetting resin layers 22, and a pair of cover films 26 constituting protective films bonded to the two outer surfaces of the laminate film 34.

In forming the laminate film 34, a thermosetting resin layer exhibiting the bonding properties at room temperature is coated to form a thermosetting resin layer on each of the two surfaces of the resin film 14, after which the thermosetting resin layers 22 are semi-set by heat treatment at a predetermined temperature. The semi-set thermosetting resin layers 22 do not exhibit the bonding properties at room temperature but do by being heated to higher than the temperature of the heat treatment conducted earlier for producing the semi-set state.

Figure 3A:
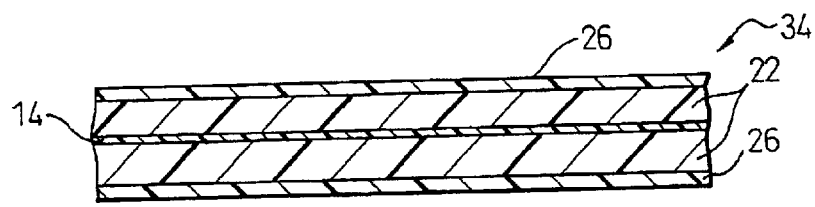
FIGS. 3A to 3F illustrate the fabrication process of the resin sheet shown in FIG. 2.
Figure 3B:
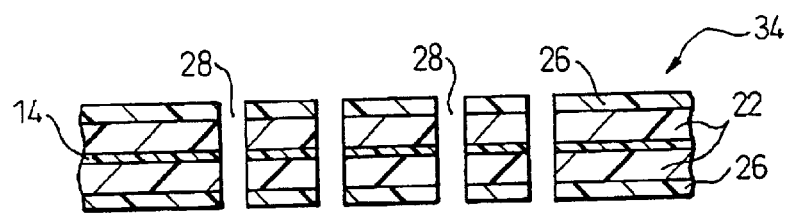

A plurality of through holes 28 are formed at predetermined portions of the laminate film 34 by a laser beam (FIG. 3B). The laser beam can be produced by carbon dioxide laser or a UV laser. The laminate film 34 has no reinforcing member, such as glass cloth, difficult to cut by the laser and therefore can be easily formed with the fine through holes 28 by a widely-used laser.

Figure 3C:
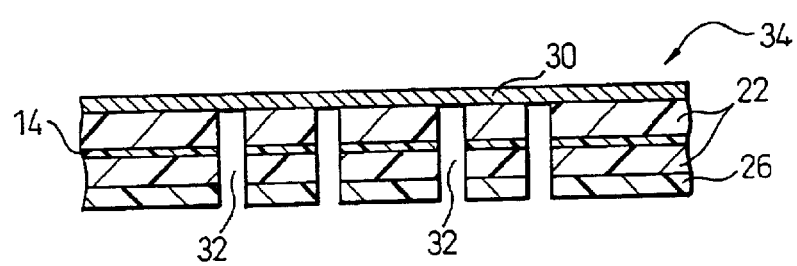

The cover film 26 on a first surface of the laminate film 34 is removed and a copper foil 30 about 18 μm thick is bonded on it (FIG. 3C). As a result, the through holes 28, each having an end thereof covered with the reverse surface of the cover film 26, and recesses 32, are formed.

Figure 3D:
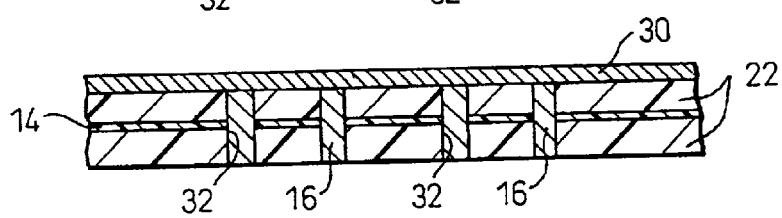

The cover film 26 on the second surface of the laminate film 34 is removed, and the electroplating is conducted with the copper foil 30 as a power supply layer so that copper metal is filled in the recess 32 thereby to form vias 16 (FIG. 3D). The vias 16 each have an end thereof connected to the reverse surface of the copper foil 30, and the other end thereof exposed to the outer surface of the thermosetting resin layer 22.

Figure 3E:
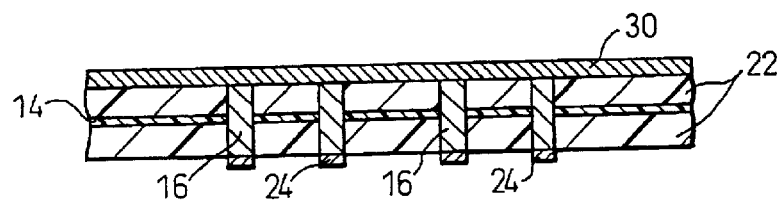

Further, at the exposed end of each via 16, a solder layer 24 about 2 to 6 μm thick is formed by electroplating with the copper foil 30 acting as a power supply layer (FIG. 3E). The solder layer 24 is formed of a solder having a melting point higher than the thermosetting temperature of the thermosetting resin constituting the thermosetting resin layers 22.

The solder usable for the solder layer 24 is a solder alloy (a solder composed of, for example, Sn—Pb, Sn—Ag or Sn—Ag—Cu alloy) or tin (Sn). A solder alloy free of lead (such as Sn—Ag or Sn—Ag—Cu) can be suitably used.

Figure 3F:
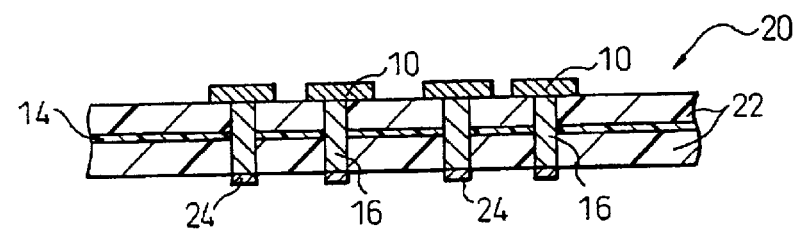

After that, the conductor pattern 10 is formed from the copper foil 30 by photolithography technique or the like to thereby form a resin sheet 20 (FIG. 3F).

The vias 16 may be formed by filling the recesses 32 with a metallic solder. In this case, the metallic solder is filled in the recesses 32 by electroplating using the copper foil 30 as a power supply layer. The metallic solder can be selected from the solder materials referred to above. Using a solder as the material to form the vias 16 is advantageous in that it simplifies the process for forming the vias 16 compared to the formation of the vias 16 using copper plating and subsequent solder plating.

Prior to the formation of the vias 16, it is also possible to form a barrier layer 38 on the copper foil 30 within the recesses 32, as shown in FIG. 9. The barrier layer 38 can be formed by electroplating the copper foil 30 within the recess 32 with a metal material, such as nickel, using the copper foil 30 as a power supply layer. During the etching of the copper foil 30 for the formation of the conductor pattern 10, the material of the vias 16 can be etched. The barrier layer 38 prevents the via material from being etched by an etchant for copper. For this purpose, it is sufficient for the barrier layer 38 to be formed of a metal material, which is resistant to an etchant for copper used, in a thickness of several micrometers.

Subsequently to the formation of the barrier layer 38, the recess 32 is filled with plated copper 52 and plated solder 54, as shown in FIG. 10A, or is filled with plated solder 54 alone, as shown in FIG. 10B, to form the vias as described above.

A plurality of resin sheets 20 formed in this way are stacked as shown in FIG. 2 and integrated by being heated to a predetermined temperature.

Figure 4:
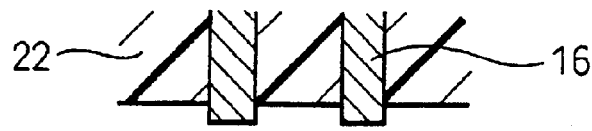
FIG. 4 is a partial sectional view showing the state of the second end of each via formed in the resin sheet shown in FIG. 2.

In stacking and integrating a plurality of the resin sheets 20, the exposed end of each via 16 on the second surface of the resin sheet 20 is brought into contact with a predetermined portion of the conductor pattern 10 formed on another resin sheet 20 by desirably regulating the electroplating conditions, such as the plating time, in such a manner as to make the exposed end of the via 16 project somewhat from the second end surface of the resin sheet 20, as shown in FIG. 4. In the case where the exposed end of each via 16 is projected somewhat from the second end surface of the resin sheet 20 as shown in FIG. 4, the electroplating conditions are regulated to assure as uniform a height, of the vias 16, as possible.

Figure 5:
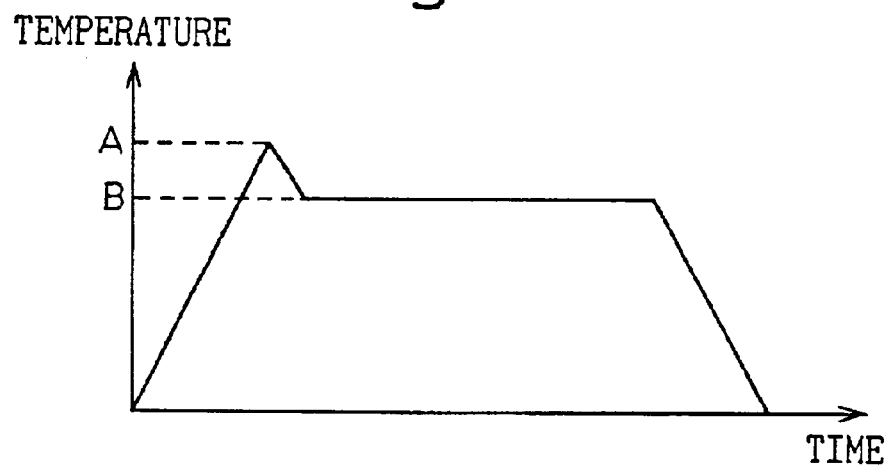
FIG. 5 is a graph showing a temperature profile for integrating, by heating, a plurality of the resin sheets in stack.

For integrating by heating a plurality of the resin sheets 20 in stack, it is desirable to conduct the heat treatment using a vacuum-thermal press according to the temperature profile shown in FIG. 5 while at the same time removing the gas generated by the heat treatment from the laminate as quickly as possible.

In the temperature profile shown in FIG. 5, the heating ambience for heating a plurality of the resin sheets 20 in a stack is increased to temperature A not lower than the melting point of the solder of the solder layer 24, and then decreased to and held at the setting temperature B of the thermosetting resin constituting the thermosetting resin layers 22 of the resin sheet 20. This temperature profile makes it possible to bond the forward end of each via 16, to a predetermined portion of the conductor pattern 10 by the solder 18 (FIG. 1), as the solder of the solder layer 24 is melted and solidified before the thermosetting resin of the thermosetting resin layers 22 is completely set.

In the case where epoxy resin having a thermosetting temperature of 180° C. is used for the thermosetting resin layers 22, for example, the solder layer 24 is desirably formed of the solder having a melting point of at least 200° C. In the case where the solder layer 24 is formed of eutectic solder having a melting point of about 180° C., the solder may be melted and flow out, or create a void in the bonding surface, when thermally setting the epoxy resin.

Figure 6:
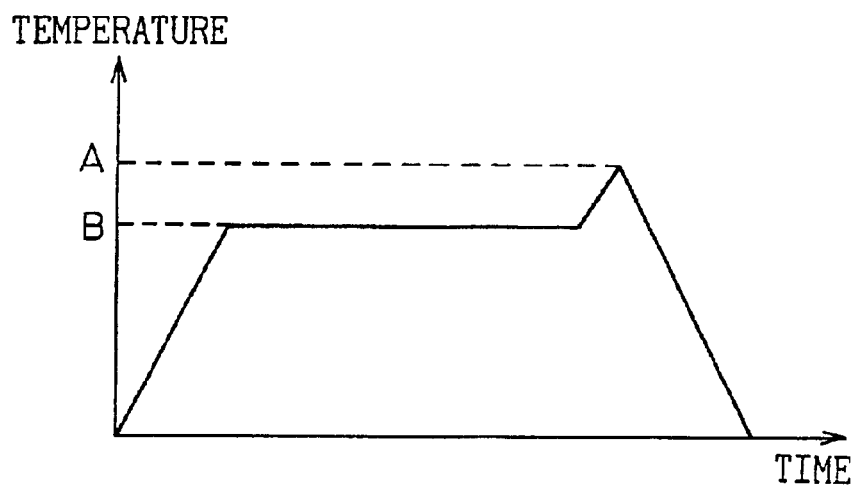
FIG. 6 is a graph showing another temperature profile for integrating, by heating, a plurality of the resin sheets in stack.
Figure 7A:
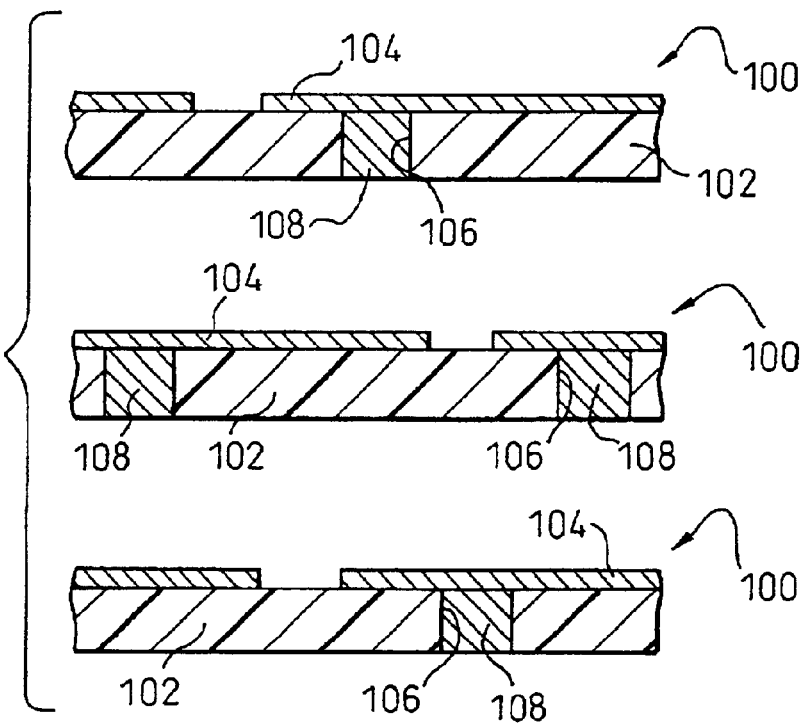
FIGS. 7A and 7B illustrate a conventional multilayer wiring board and a method of fabricating the same.
Figure 7B:
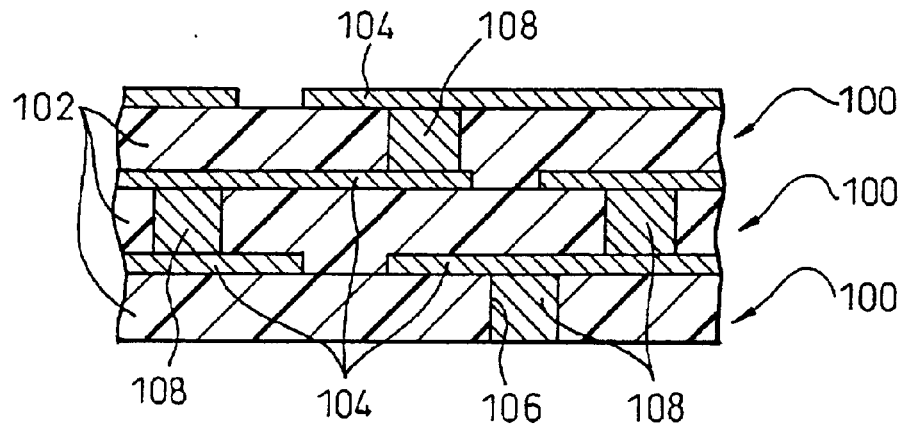

While integrating by heating a plurality of the resin sheets 20 in stack, it is also possible to bond the forward end of each via 16 to a predetermined portion of the conductor pattern 10 using the solder 18 (FIG. 1) without causing any solder outflow or creating a void in the bonding surface, by conducting the heat treatment according to the temperature profile shown in FIG. 6.

In the temperature profile shown in FIG. 6, the temperature is increased to and held at the setting level B of the thermosetting resin constituting the thermosetting resin layers 22 of the resin sheet 20 for a predetermined length of time, after which the temperature is decreased to the level A not lower than the melting point of the solder of the solder layer 24. The temperature profile shown in FIG. 6 makes it possible to melt and solidify the solder of the solder layer 4 after the thermosetting resin of the thermosetting resin layers 22 is completely set and, therefore, the forward end of the via 16 can be bonded with a predetermined portion of the conductor pattern 10 with a satisfactory appearance of the solder junction.

As described above, according to the temperature profiles shown in FIGS. 5 and 6, the forward end of each via 16 and a predetermined portion of the conductor pattern 10 can be bonded to each other by the solder 18 without causing any solder outflow or a junction void. This indicates that the heat treatment is effectively conducted along a temperature profile which precludes the possibility of the protracted simultaneous proceeding of the setting of the thermosetting resin layer 22 and the melting of the solder layer 4.

After integrating, by heating, a plurality of the resin sheets 20 in a stack, the preflux (not shown) is preferably coated on the surface of the conductor patterns 10 in order to prevent oxidization of the surface of the conductor patterns 10 (FIG. 1) composed of copper and improve the solder wettability for soldering the package members including a semiconductor element. A water-soluble preflux is desirable for this purpose, as it can be left selectively on the metal by washing in water after being coated on the metal conductor patterns 10.

The multilayer wiring board according to the invention shown in FIG. 1, as described above, even if heated for mounting the package members including a semiconductor element by soldering or the like, is thermally expanded/contracted to a minimum degree because the thermosetting resin layers making up each insulating layer 12 are reinforced by the resin film 14 having a low coefficient of linear expansion. As a result, the multilayer wiring board according to the invention has a smaller difference of thermal contraction with the package members such as a semiconductor element and thus a higher reliability of connection with the package members.

Figure 8:
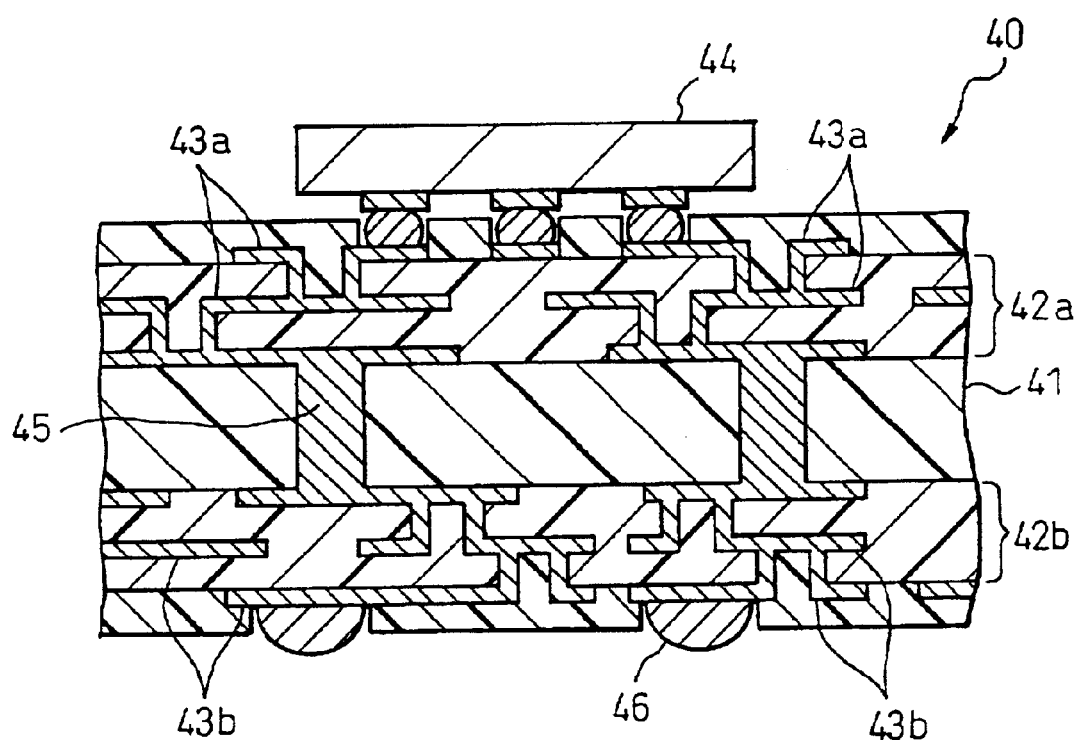
FIG. 8 illustrates a build-up multilayer wiring board fabricated by use of a multilayer wiring board according to the invention.

The multilayer wiring board according to the invention can be used as a core member for fabricating a build-up multilayer wiring board by stacking a conductor pattern on each of the two surfaces of the core member according to the well-known build-up method. FIG. 8 shows an example of a build-up multilayer wiring board fabricated by the build-up method using the multilayer wiring board according to the invention as a core member. The build-up multilayer wiring board 40 shown in FIG. 8 comprises a core substrate 41 making up a multilayer wiring board according to the invention formed using the resin sheets each including the thermosetting resin layers and the resin film having a low coefficient of linear expansion, and build-up layers 42a, 42b formed on the two surfaces, respectively, of the core substrate 41 by the build-up method. The core substrate 41 may have construction as shown is FIG. 1. The build-up layers 42a, 42b each include a plurality of conductor patterns 43a, 43b stacked with insulating layers. The conductor patterns 43a on the upper surface side and the conductor patterns 43b on the lower surface side of the core substrate 41 are connected to each other by through holes 45 formed through the core substrate 41. This build-up multilayer wiring board 40 can be used with the package parts such as a semiconductor chip 44 mounted on the upper surface thereof and a package substrate (not shown) on which the multilayer wiring board 40 is mounted through solder bumps 46 on the lower surface thereof.

As described above, the conductor patterns can be formed in high density on the build-up multilayer wiring board finally fabricated by using the multilayer wiring board according to the invention as a core member.

With the multilayer wiring board according to the invention, the difference of thermal contraction with the package members such as a semiconductor element can be minimized for an improved reliability of connection with the package members. Consequently, the reliability can be greatly improved of the semiconductor device, etc. produced by packaging a semiconductor element, etc. on a multilayer wiring board according to the invention or a different multilayer wiring board fabricated based on a multilayer wiring board, according to the invention, as a core member.

We claim:

1. A multilayer wiring board comprising a plurality of conductor patterns stacked with an insulating layer composed of a thermosetting resin interposed between adjacent conductor patterns, wherein the insulating layers are each formed of a pair of film-like thermosetting resin layers and a resin film having a lower coefficient of linear expansion than, and sandwiched between, the thermosetting resin layers, wherein the electrical connection between the stacked conductor patterns is established by vias formed through the insulating layers, and wherein each said via has an end thereof coupled to a conductor pattern through an intervening barrier layer and the other end thereof fixed to another conductor pattern by a metal solder material.

2. A multilayer wiring board according to claim 1, wherein said metal solder material has a melting point higher than the thermosetting temperature of said thermosetting resin.

3. A multilayer wiring board according to claim 2, wherein said metal solder material is selected from the group of a tin solder and a lead-free tin alloy solder.

4. A multilayer wiring board according to claim 1, wherein the coefficient of linear expansion of said resin film at room temperature is not more than $20 \times 10^{-6}$/K.

5. A multilayer wiring board comprising, the multilayer wiring board according to claim 1 as a core member, and a plurality of conductor patterns formed on the two surfaces of said core member, respectively, with an insulation layer interposed between adjacent conductor patterns.

6. A multilayer wiring board according to claim 1, wherein the resin film is selected from the group of aramid, liquid crystal polymer, and polyimide resins.

7. A multilayer wiring board comprising a plurality of conductor patterns stacked with an insulating layer composed of a thermosetting resin interposed between adjacent conductor patterns, wherein the insulating layers are each formed of a pair of thicker film-like thermosetting resin layers and a much thinner resin film having a lower coefficient of linear expansion than, and sandwiched between, the thermosetting resin layers, and wherein the electrical connection between the stacked conductor patterns is established by vias formed through the insulating layer, wherein each said via has an end thereof coupled to a conductor pattern through an intervening barrier layer and the other end thereof fixed to another conductor pattern by a metal solder material.

8. A multilayer wiring board according to claim 6, wherein said thicker film-like thermosetting resin layers are in a thickness range is about 50 $\mu$m thick, and wherein said much thinner resin film thickness range is about 4.5 to9 $\mu$m thick.

* * * * *